United States Patent [19]
Kurino et al.

[11] Patent Number: 5,610,100
[45] Date of Patent: Mar. 11, 1997

[54] METHOD FOR CONCURRENTLY FORMING HOLES FOR INTERCONNECTION BETWEEN DIFFERENT CONDUCTIVE LAYERS AND A SUBSTRATE ELEMENT OR CIRCUIT ELEMENT CLOSE TO THE SUBSTRATE SURFACE

[75] Inventors: Hiroyuki Kurino; Yoichi Miyai, both of Ibaraki, Japan

[73] Assignee: Texas Instruments Inc., Dallas, Tex.

[21] Appl. No.: 421,708

[22] Filed: Apr. 13, 1995

[51] Int. Cl.⁶ .................................................. H01L 21/283
[52] U.S. Cl. ........................... 437/195; 437/189; 437/228
[58] Field of Search ................................... 437/189, 190, 437/192, 195, 228 S

[56] References Cited

U.S. PATENT DOCUMENTS

| | | | |
|---|---|---|---|
| 5,100,817 | 3/1992 | Cederbaum et al. | 437/41 |
| 5,229,325 | 7/1993 | Park et al. | 437/187 |
| 5,279,989 | 1/1994 | Kim | 437/195 |
| 5,308,795 | 5/1994 | Hawley et al. | 437/195 |
| 5,393,703 | 2/1995 | Olowolafe et al. | 437/197 |

*Primary Examiner*—T. N. Quach
*Attorney, Agent, or Firm*—William W. Holloway; Leo N. Heiting; Richard L. Donaldson

[57] ABSTRACT

In a semiconductor device having conductive paths for electrically coupling a substrate surface with a second conductive/wiring layer, the substrate and the second conductive layer having a first conductive layer therebetween, a second insulating layer separating the first and the second conductive/wiring layers is replaced by a process for forming a protective covering over the patterned and etched first conductive layer. The second conductive layer will provide an electrical contact with the exposed conducting material in the contact holes without the critical patterning and etching process steps typically required when the second insulating layer is formed.

14 Claims, 5 Drawing Sheets

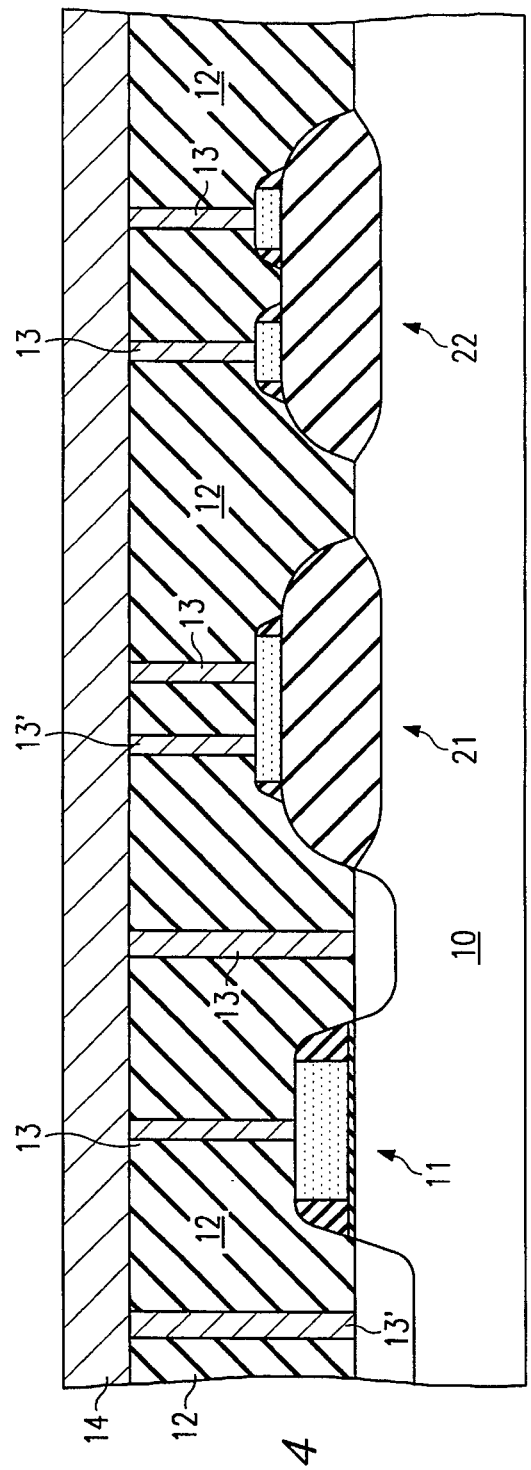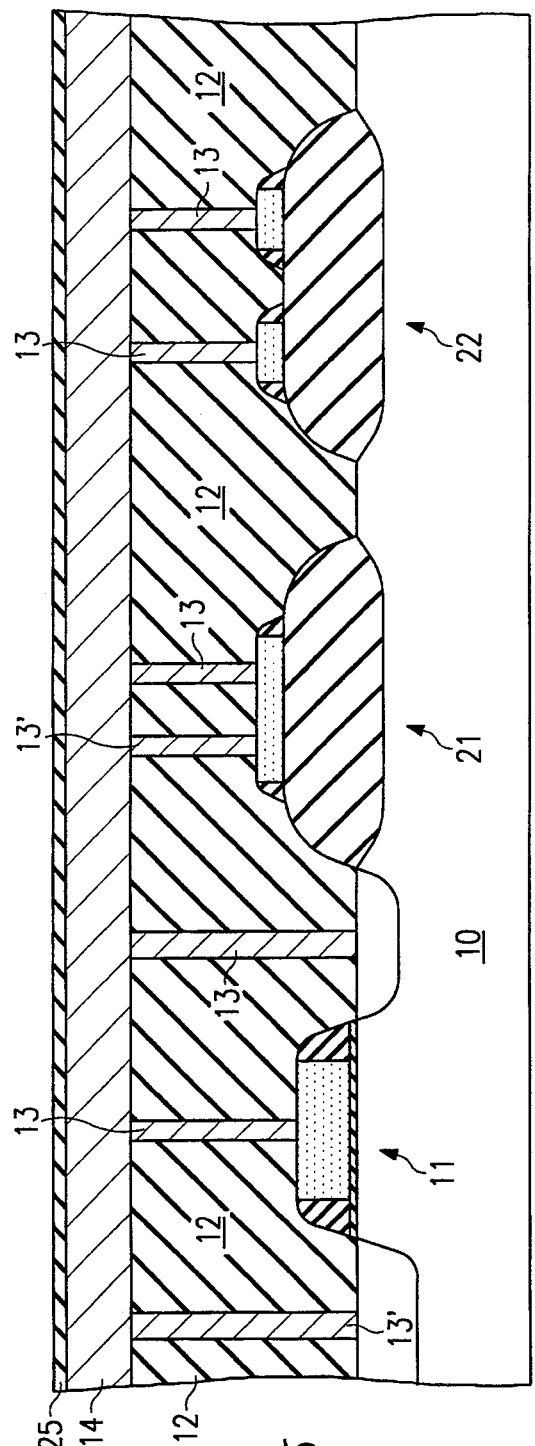
FIG. 4
FIG. 5

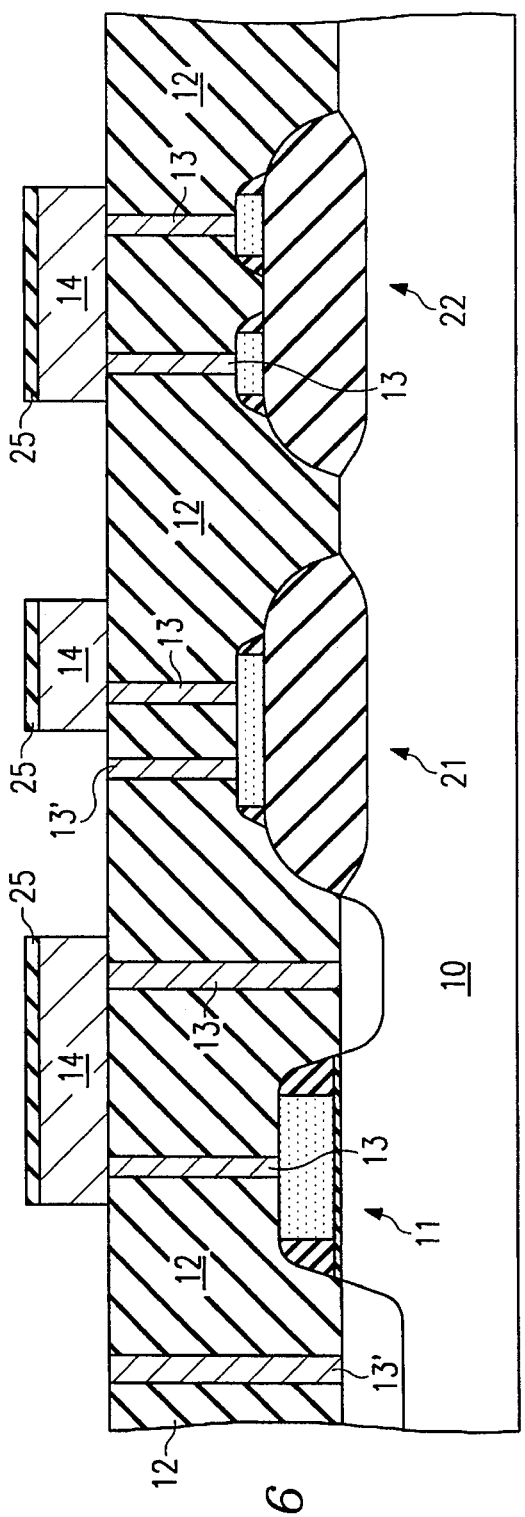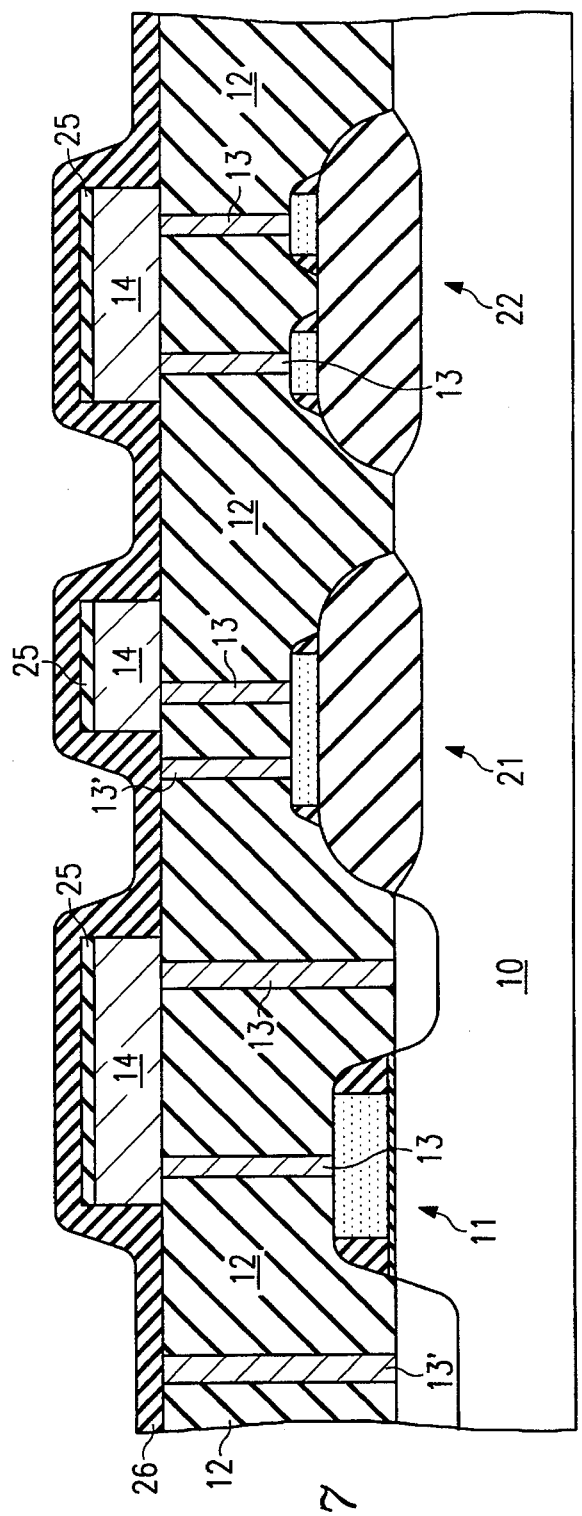

METHOD FOR CONCURRENTLY FORMING HOLES FOR INTERCONNECTION BETWEEN DIFFERENT CONDUCTIVE LAYERS AND A SUBSTRATE ELEMENT OR CIRCUIT ELEMENT CLOSE TO THE SUBSTRATE SURFACE

BACKGROUND OF THE INVENTION

1. Field of the Invention

This invention relates generally to a process for the fabrication of semiconductor devices and, more particularly, to the process for the electrical interconnection of a plurality of wiring layers in an integrated circuit device.

2. Description of the Related Art

In the related art, contact and via conductive paths are fabricated in integrated circuit devices for providing interconnections between various circuit components and the wiring layers coupling the circuit components. Contact conductive paths connect a first wiring layer with the surface of the semiconductor substrate and/or to the circuit elements fabricated on the surface of the semiconductor substrate. Via conductive paths connect a second wiring layer through a second insulator layer to the first wiring layer. When it is necessary to connect the second wiring layer to the semiconductor substrate, both a via and a contact are used. A conductive path is thus established from the second wiring layer through a via to a conductive region associated with the first wiring layer. From the conductive region associated with the first wiring layer, a contact through the first insulating layer is coupled to the surface of the substrate.

Referring to FIG. 1, an integrated circuit device with a plurality of wiring layers, fabricated according to the related art, is shown. A component 11 is fabricated on the surface of a semiconductor substrate 10. Contacts 13 provide conducting paths through the first insulating layer 12 to selected portions of the first wiring layer 14. The via conductive paths 16 provide a electrical connections from selected portions of the first wiring layer 14 through a second insulating layer 15 and are coupled to predetermined portions of the second wiring layer 17. A final insulating layer 18 is added to protect the second wiring layer 17. The steps for fabricating this portion of an integrated circuit device with a plurality of wiring layers includes the steps of Forming a first insulating layer over a semiconductor substrate;

Patterning contact holes in the first insulating layer;

Etching the contact holes in the first insulating layer;

Forming the contact hole plugs (i.e., filling the holes with a conductive material);

Forming a first conductive layer over first insulating layer and the plugged holes;

Patterning the first conductive layer;

Etching the first conductive layer to form the first wiring layer;

Forming a second insulating layer over the first insulating layer and the first wiring layer;

Patterning the via holes in the second insulating layer;

Etching the vias holes in the second insulating layer;

Forming via hole plugs

Forming a second conductive layer over the second insulating layer and the plugged vias;

Patterning the second conductive layer; and

Etching the second conductive layer to form a second wiring layer.

This process includes four steps of fine patterning and etching which are required for the fabrication of conducting paths, i.e., for the formation of the holes, for the structure of the first wiring layer, for the formation of the vias, and for the structure of the second wiring layer. The patterning and etching processing steps are expensive and time consuming resulting in increased cost for the integrated circuit device.

A need has therefore been felt for a process for the fabrication of the interconnections between the semiconductor substrate and the wiring layers of an integrated circuit which would reduce the number of fine patterning and etching steps, thereby reducing the cost of the circuit and the reducing the fabrication time.

SUMMARY OF THE INVENTION

The aforementioned and other features are accomplished, according to the present invention, by providing a process for providing a conductive path for electically coupling a substrate with a second wiring layer, the second wiring layer separated from the substrate by a first wiring layer. A first insulating layer, separating the substrate from the first conductive layer, is formed on the surface of the semiconductor substrate. The first insulating layer is then processed, using patterning and etching techniques, to provide holes to the surface of the first insulating layer. The holes between the semiconductor substrate and the surface of the first insulating layer are then plugged, thereby providing conductive paths from the semiconductor surface to the surface of the first insulating layer as in the related art. A first conductive layer is formed on the first insulating region. However, the first conductive layer is not patterned and etched to form a first wiring layer. The present invention provides an insulating covering material over the first conductive layer. The covering material and the first conductive layer are patterned and etched to provide a first wiring layer with the insulating covering material thereon. This patterning and etching results in the exposure of selected plugged holes in the first insulating region. A side wall process covers the exposed portions of the first wiring layer. A second conductive layer is then deposited on the exposed surface and will make electrical contact with the exposed conductive paths in the first insulating layer. The process for providing the insulating covering material for the first wiring layer does not require critical processing techniques, as do the typical patterning etching processes, and therefore the cost and fabrication time for the device are reduced.

These and other features of the present invention will be understood upon reading of the following description in conjunction with the Figures.

BRIEF DESCRIPTION OF THE DRAWINGS

FIG. 4 is a cross-sectional view of the integrated circuit, according to the present invention, after the forming of the first conductive layer.

FIG. 5 is a cross-sectional view of the integrated circuit, according to the present invention, after the forming of the stack oxide layer on the first conductive layer.

FIG. 6 is a cross-sectional view of the integrated circuit, according to the present invention, after the patterning and etching of the stack oxide and the first conductive layer, to provide a first wiring layer.

FIG. 7 is a cross-sectional view of the integrated circuit, according to the present invention, after the forming of the side wall oxide layer.

DESCRIPTION OF THE PREFERRED EMBODIMENT(S)

1. Detailed Description of the Drawings

Figure 1:
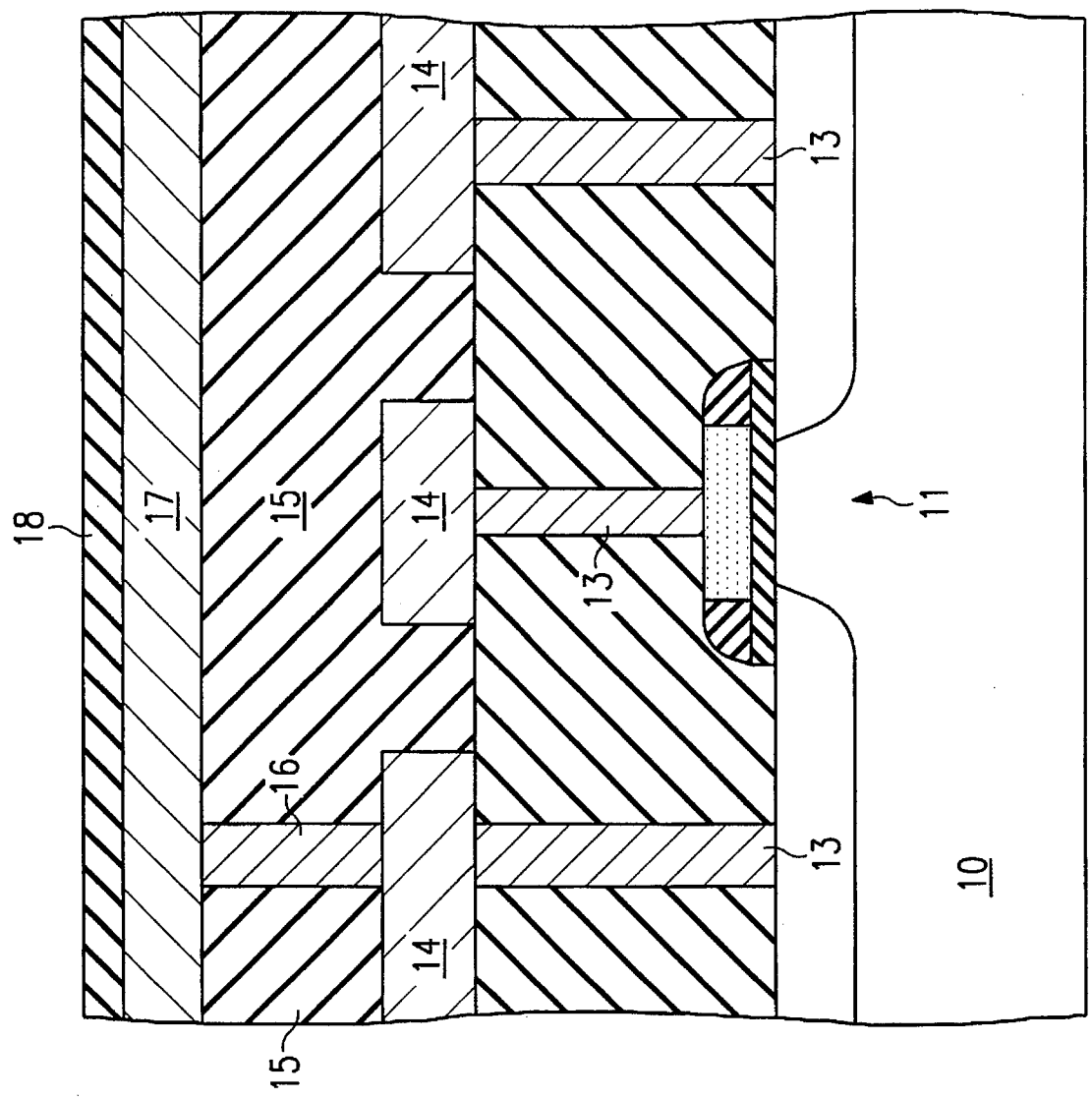
FIG. 1 is cross-sectional view of an integrated circuit fabricated according to the related art, the device having two wiring layers, the first wiring layer completing the electrical coupling between the device substrate and the second wiring layer.

FIG. 1 has been discussed in relationship to the related art.

Figure 2:
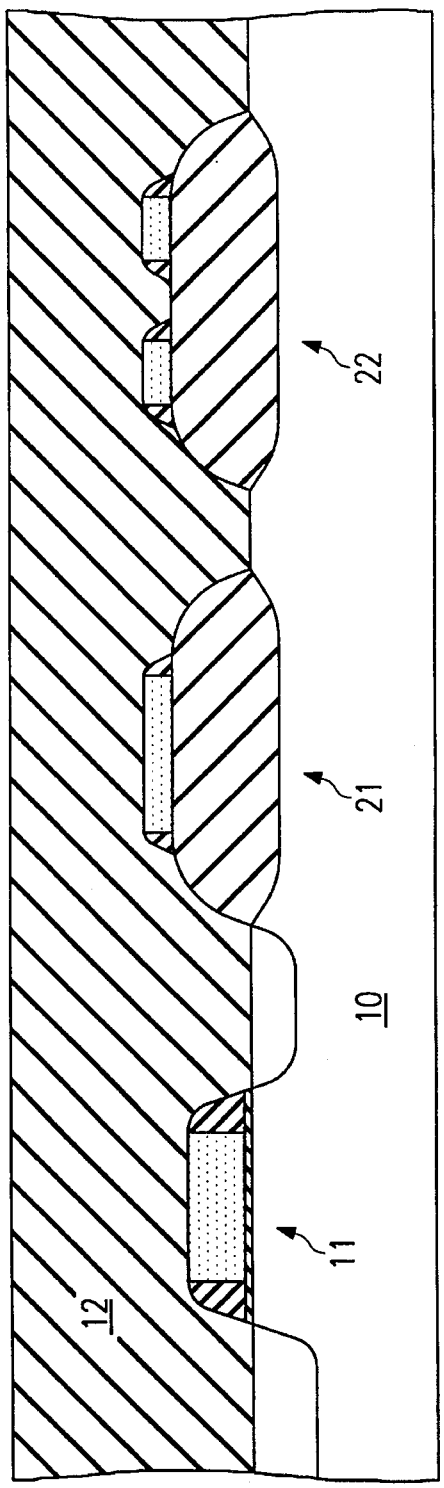
FIG. 2 is a cross-sectional view of the integrated circuit, according to the present invention, after the deposition of the first insulating layer on the semiconductor substrate.

Referring to FIG. 2, a substrate 10 (typically fabricated from silicon) has semiconductor components 11 and 21 formed thereon according to typical semiconductor processing techniques. An insulating layer 12 ( typically a metal level oxide ) is formed thereon.

Figure 3:
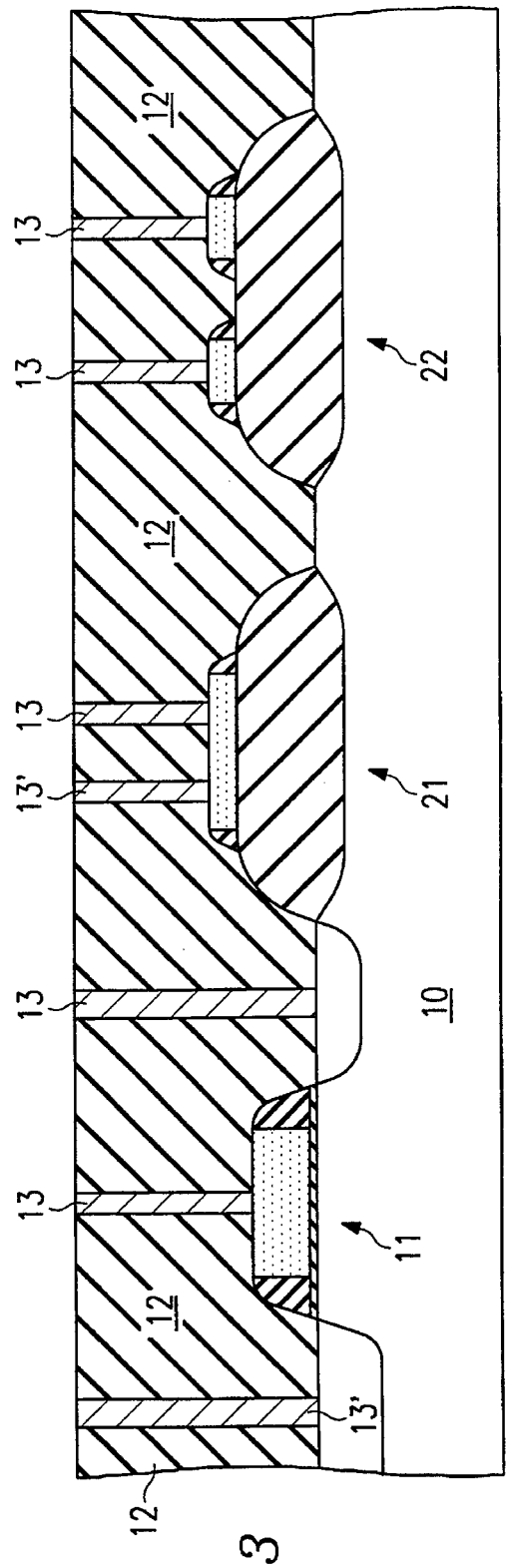
FIG. 3 is a cross-sectional view of the integrated circuit, according to the present invention, after the patterning, etching and plugging of the holes according to the present invention.

The first insulating layer 12 has a patterning process which identifies where the holes 13 in the first insulating layer 12 are to be located. After the patterning operation, an etching process creates the holes 13 in the locations determined by the patterning process. The holes 13 extend to the substrate or to portions of the components 11 and 21 to which electrical contacts are to be made. The holes 13 are then plugged (filled) with a conductive material. The result of the patterning, etching, and plugging steps is shown in FIG. 3.

Referring to FIG. 4, a conductive layer 14 is formed on the insulating layer 12 and the (plugged) holes 13. The conductive layer 14 is in electrical contact with the conductive material in the holes 13. Next a stack oxide layer 25 is formed on the first conductive layer 14 as shown in FIG. 5.

An patterning process is performed on the stack oxide 25 and an etching process removes selected stack oxide 25 and the conductive layer 14 from preselected regions of the first insulating layer 12. This etching process provides the first wiring layer 14 and also exposes the conductive material in selected hole 13'. The results of these operations are shown in FIG. 6.

Figure 8:
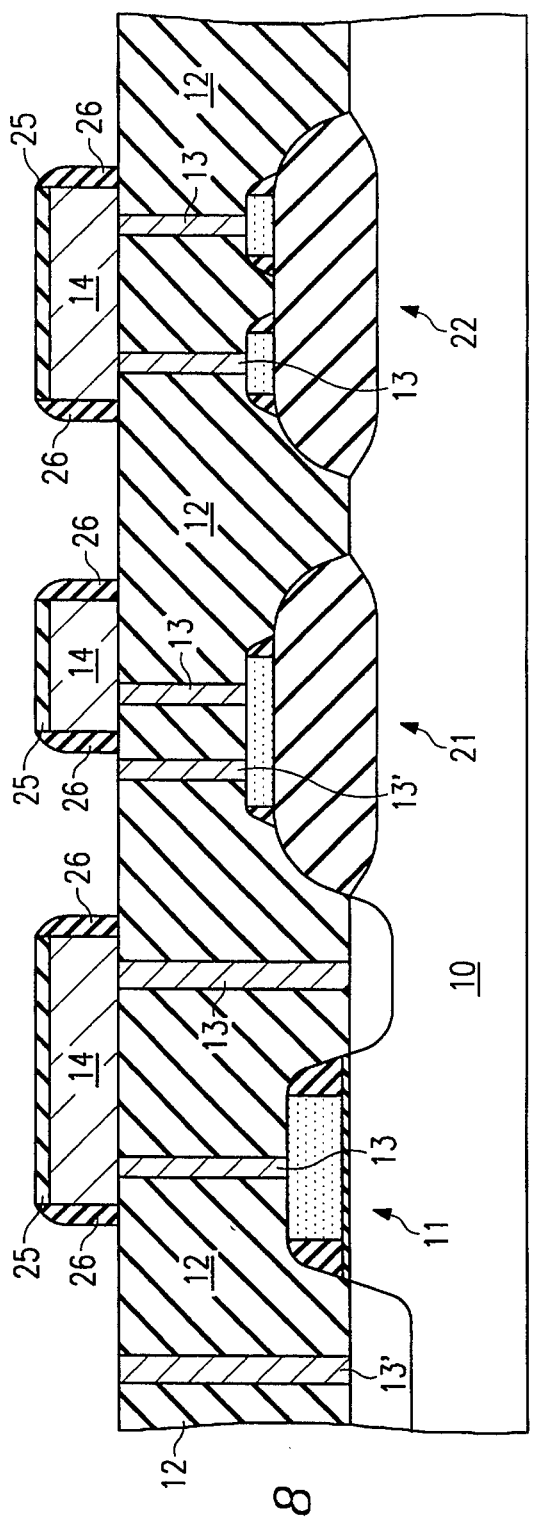
FIG. 8 is a cross-sectional view of the integrated circuit, according to the present invention, after the etching of the side wall oxide layer.

Referring to FIG. 7, a side wall oxide 26 is formed on the exposed surfaces of the first insulating layer 12, the exposed surfaces of the conductive material in the selected holes 13', on the exposed surfaces of the first conductive layer 14, and on the stack oxide 25. The side wall oxide 26 is etched exposing the conductive material in the selected holes (along with the surrounding first insulating layer 12) and the stack oxide 25. However, the formerly exposed portions of the first conductive layer 14 are now protected by the remaining side wall oxide. The result of these operations is shown in FIG. 8.

Figure 9:
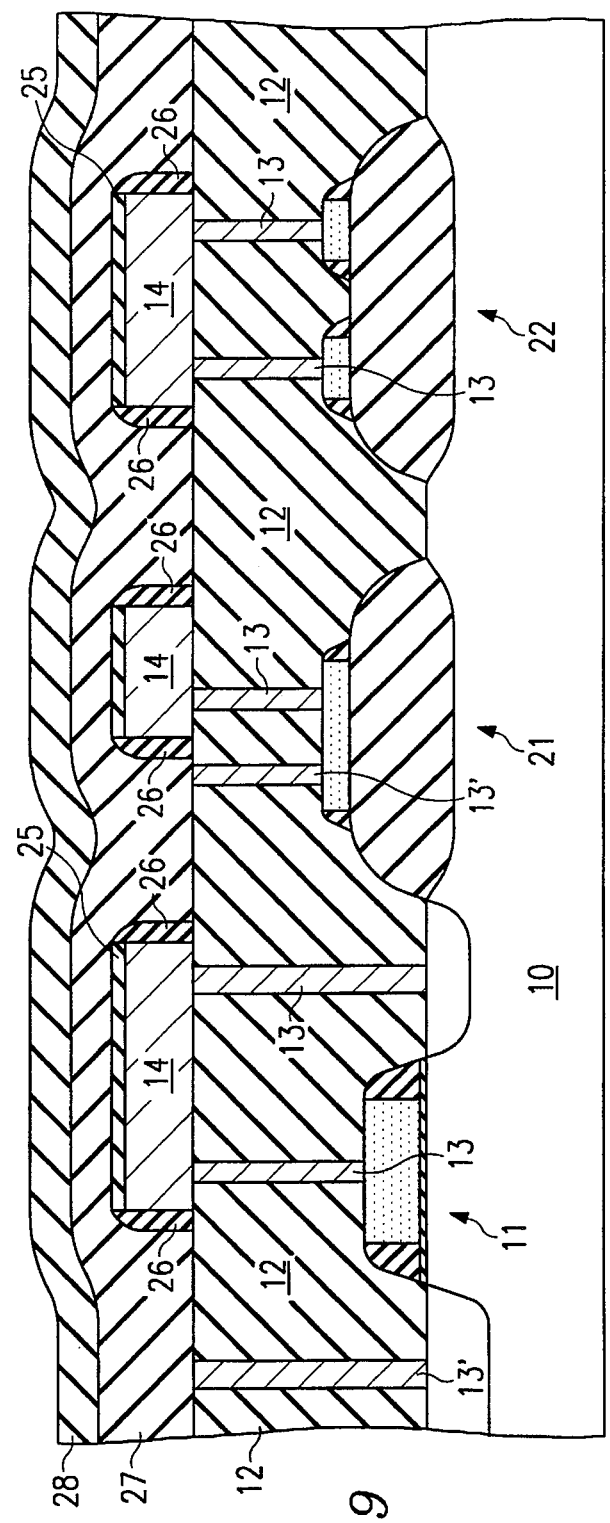
FIG. 9 is a cross-sectional view of the integrated circuit, according to the present invention, after the forming of the second conductive layer and the final insulating layer.

Referring now to FIG. 9, a second conductive layer 27 is deposited on the exposed surfaces and a layer of insulating material 28 formed on the second conductive layer 27. Note that the second conductive layer can be etched and patterned to form the second wiring layer.

2. Operation of the Preferred Embodiment(s)

The FIGS. 2–9 illustrate the steps in fabricating a two wiring layer integrated circuit, according to the present invention. The steps can be summarized as:

Forming a first insulating layer over the semiconductor substrate

Patterning the holes on the first insulating layer;

Etching the holes in the first insulating layer;

Forming the plugs in the holes;

Deposition of the first conductive layer;

Forming a stack oxide layer on the first conductive layer;

Patterning of the stack oxide layer;

Etching the stack oxide layer and the first conductive layer to form a first wiring layer;

Forming the side wall oxide layer;

Etching the side wall oxide to provide electrical insulation for the first wiring layer;

Deposition of the second conductive layer;

Patterning of the second conductive layer; and

Etching of the second conductive layer to form a second wiring layer.

Comparing the process steps of the related art and the process steps of the present invention,, the electrical connection between the substrate and the first and second wiring layers are formed by only one set of sensitive patterning and etching operations, i.e., in the first insulating layer. The patterning and etching steps for conducting paths in the second insulating layer are replaced, in the present invention, by the deposition of the stack oxide (rather than the metal inter-level oxide) layer prior to the patterning and etching step of the first conductive layer and by the forming and etching of the side wall oxide layer. The process steps replacing of the present invention which replace the fine patterning and etching steps for the second insulating layer are not critical and are, therefore, less costly and time-consuming.

While the invention has been described with particular reference to the preferred embodiment, it will be understood by those skilled in the art that various changes may be made and equivalents substituted for elements of the preferred embodiment without departing from the invention. For example, the present invention has been described with particular reference to two conductive layers and a semiconductor substrate and components fabricated thereon. However, when the number of conducting layers is increased beyond two, the sensitive patterning and etching process steps that are normally required for the each insulating layer can be replaced by the stack oxide layer, side wall oxide layer process for selected associated conductive/ wiring layers. It will be clear that for interconnection between two conductive/wiring layer in multiple conductive/wiring layers, at least one sensitive patterning and etching process is required. In addition, many modifications may be made to adapt a particular situation and material to a teaching of the present invention without departing from the essential teaching of the present invention.

As is evident from the foregoing discussion, certain aspects of the invention are not limited to the particular details of the examples illustrated, and it is therefore contemplated that the claims shall cover all modifications and applications as do not depart from the spirit and scope of the invention.

What is claimed is:

1. A method for concurrently forming electrical connections between areas proximate a semiconductor substrate surface and both a first and a second conductive layer, said method comprising the steps of:
 a.) forming a first insulator layer over a surface of a semiconductor substrate and over any circuit element formed thereon;
 b.) patterning and etching holes in said first insulator region to expose regions to which electrical contact is to be made;
 c.) forming concurrently a connection plug of conductive material in said holes, said electrical material filling each hole and forming electrical connections with said exposed areas;
 d.) depositing over said first insulator layer and said filled holes said first conductive layer;
 e.) forming a second insulating layer over said first conductive layer;
 f.) patterning and etching said second insulating layer and said first conductive layer to expose selected filled holes in said first conductive layer;
 g.) forming a side wall insulator layer over said patterned and etched first conductive and second insulating region;
 h.) etching said side wall insulator layer to expose said selected filled holes in said first insulating level; and
 i.) depositing said second conductive layer.

2. The method of claim 1 further comprising the step of:
 j.) patterning and etching said second conductive layer.

3. The method of claim 1 wherein step e includes the step of providing a pattern in said first conductive pattern to implement a wiring layer.

4. The method of claim 1 wherein steps g and h cover regions of said first conductive layer exposed during step f.

5. In a semiconductor device, a method for electrically connecting a surface region with a first and a second conductive layer, said method comprising the steps of:
 a.) forming a first insulating region on said surface region;
 b.) patterning and etching said first insulating region to provide holes exposing selected areas on said surface region;
 c.) filling said holes with a conductive material, said conductive material being electrically coupled to a portion of said selected areas;
 d.) forming a first conductive layer on said first insulating region and said filled holes;
 e.) forming a second insulating region on said first conductive layer;
 f.) patterning and etching said first conductive region and said second insulating region to expose selected filled holes;
 g.) covering exposed regions of said first conductive region with an insulating material; and
 h.) forming a second conductive layer.

6. The method of claim 5 further comprising the step of:
 i.) patterning and etching said second conductive layer.

7. The method of claim 5 wherein step g includes the steps of:
 forming a third insulating layer; and
 etching said third insulating layer to expose said selected filled holes.

8. The method of claim 5 further including the step of implementing said surface with a semiconductor substrate and components fabricated thereon.

9. The method of claim 7 wherein said forming a third insulating layer step includes the step of forming a side wall layer.

10. A method for electrically coupling a plurality of layers of conductive paths to a semiconductor substrate and associated components fabricated thereon, said method comprising the steps of:
 a.) forming a first insulating layer over said substrate and associated components;
 b.) forming conductive columns through said first insulating layer, said conducting columns electrically coupled to regions of said substrate and said associated components;
 c.) forming a first conductive layer on said first insulating layer and said conductive columns;
 d.) forming a second insulating layer on said first conductive layer;
 e.) removing selected portions of said first conducting layer and said second insulating layer to expose selected conductive columns;
 f.) covering regions of said first conductive layer exposed by said removing step; and
 g.) forming a second conductive layer.

11. The method of claim 10 further comprising the step of:
 h.) patterning and etching said second conductive layer.

12. The method of claim 10 wherein step f includes the steps of:
 forming a layer of side wall oxide; said side wall oxide providing an insulating layer over said first conductive layer, said second insulating layer, and said selected conducting columns; and
 etching said layer of side wall oxide to expose said selected conductive columns.

13. The method of claim 10 wherein step e includes the step of patterning and etching said second insulating layer and said first conductive layer.

14. The method of claim 10 wherein step b includes the steps of:
 patterning and etching said first insulating layer to form holes in said first insulating layer; and
 filling said holes with a conductive material.

* * * * *